United States Patent [19]

Copp

[11] Patent Number: 4,857,135

[45] Date of Patent: Aug. 15, 1989

[54] COMPOSITE BOARD PRESS

[76] Inventor: John B. Copp, 1208 Luanne, Fullerton, Calif. 92631

[21] Appl. No.: 214,897

[22] Filed: Jun. 29, 1988

Related U.S. Application Data

[63] Continuation of Ser. No. 832,818, Feb. 24, 1986, abandoned.

[51] Int. Cl.$^4$ .......................... B30B 1/32; B30B 7/02; B30B 15/04

[52] U.S. Cl. .................................... 156/580; 100/194; 100/258 R; 100/269 R; 156/583.1; 425/338

[58] Field of Search ................ 156/580, 583.1, 583.91; 425/338; 100/93 P, 194, 195, 199, 258 R, 258 A, 257, 269 R

[56] References Cited

U.S. PATENT DOCUMENTS

| | | | |
|---|---|---|---|
| 631,286 | 8/1899 | Euston | 100/199 |
| 697,287 | 4/1902 | Spaulding | 100/269 R X |
| 2,349,805 | 5/1944 | Tapper | 425/338 |
| 2,500,791 | 3/1950 | Baldwin | 100/199 |
| 2,558,796 | 7/1951 | Tapper | 100/194 |
| 2,565,639 | 8/1951 | Waldie . | |
| 3,526,188 | 9/1970 | Carlsson . | |
| 3,757,680 | 9/1973 | Williams . | |
| 4,157,066 | 6/1979 | Pretty . | |
| 4,203,359 | 5/1980 | Baltschun | 100/269 R X |
| 4,351,724 | 9/1982 | Jones | 100/199 |
| 4,597,322 | 7/1986 | Garnjost | 92/167 |

OTHER PUBLICATIONS

Two-side advertisement, 9/23/85, *Rubber & Plastics News*, p. 153 of Karder Machine Co., opposite page MKB Industries, Inc.

4 page product literature, "Daniels Hydramold-Hinged Platen Presses for Rubber Moulding".

Two-side product literature from BIPEL Limited.

Two-side product literature from Technical Machine Products of Cleveland, Ohio.

12 page product literature catalog from Wabash Hydraulic Press Divn. of Wabash Metal Products, Inc. of Wabash, IN, "Wabash Hydraulic Compression Presses".

4 page product literature of BIPEL on MICROMOULD 50.

2 page new product release from Vacuum-Press Intl, Inc., 2/24/84, "Vacuum Press Capabilities".

4 page document of Vacuum-Press Intl, Inc. by Bob Carter, "Introduction to Vacuum Presses".

4 page document of Vacuum-Press Intl, Inc., "General Specifications-Series 12 and Series 18 Vacuum Press".

4 page document of Vacuum-Press Intl, Inc., "General Specifications-Series 24 Vacuum Press".

4 page document of Vacuum-Press Intl, Inc., "General Specifications-Series 30-Series 36-Series 42 Vacuum Press".

Two-side product literature from Vacuum-Press Intl, Inc., "A Revolutiionary New Laminating Press for Multi-Layer Technology".

Three-side product literature folder of Vacuum-Press Intl, Inc., "Introducing a Revolutionary Concept of Multi-Layer Technology".

*Primary Examiner*—Michael W. Ball
*Assistant Examiner*—Steven D. Maki
*Attorney, Agent, or Firm*—Knobbe, Martens, Olson & Bear

[57] ABSTRACT

A composite board press is provided with a single set of platen supporting rods for supporting and loosely guiding a plurality of platens, the heights of which are dually adjustable. The invention also includes a method of laminating a composite to form a printed circuit board by applying heat and pressure in which the pressure is applied at points exterior to the area of the composite and in which the press is repeatedly opened and closed in the presence of an evacuated environment when the resin in the composite is liquid.

15 Claims, 3 Drawing Sheets

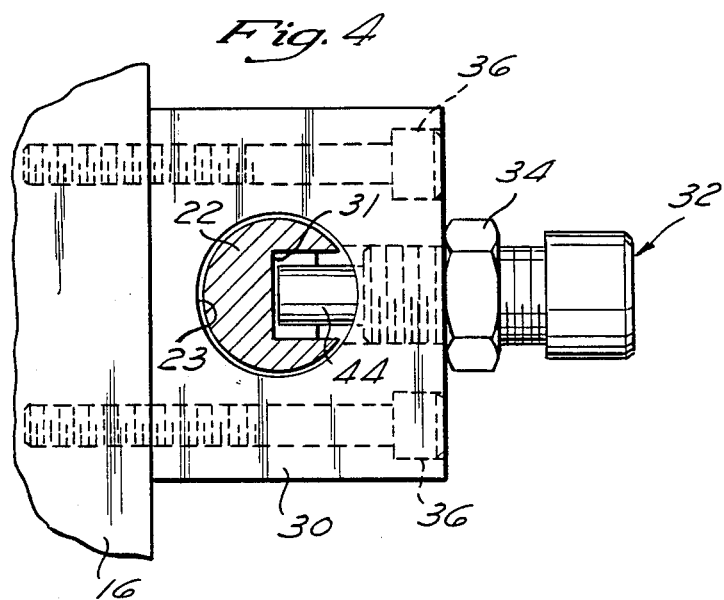
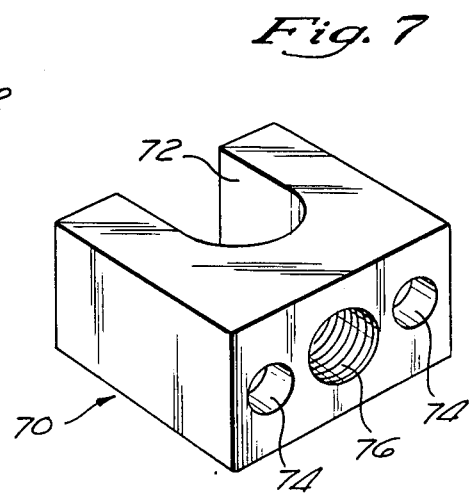
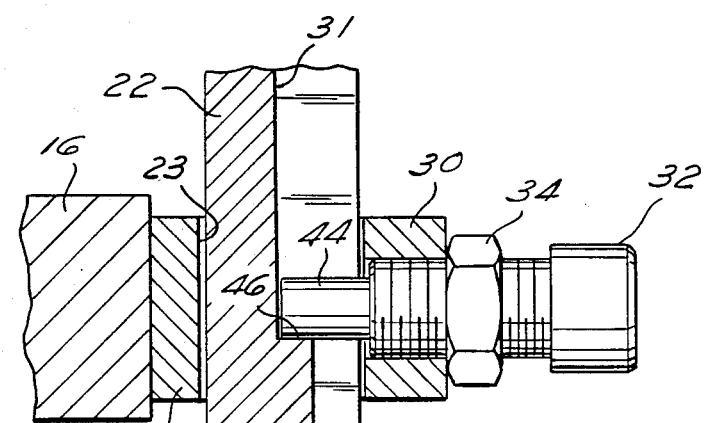
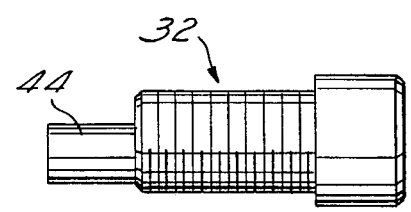
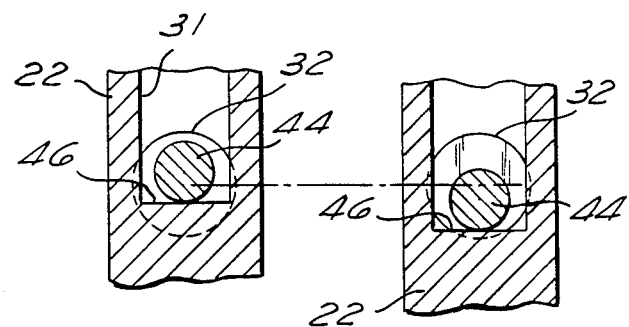
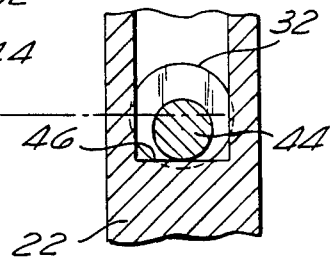
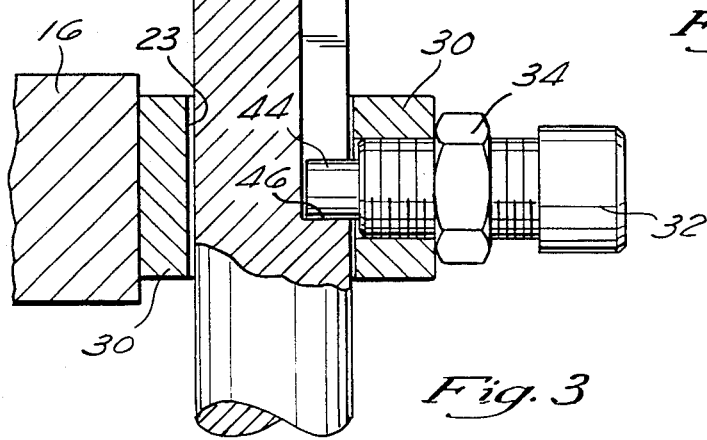

COMPOSITE BOARD PRESS

This application is a continuation of application Ser. No. 832,818, filed 02/24/86, now abandoned.

BACKGROUND OF THE INVENTION

This invention relates to methods of laminating composites in general, and more specifically to methods of laminating printed circuit boards, and to hydraulic presses used in these methods.

The demand for multilayer printed circuit boards has increased with the general trend toward miniaturization of electronic circuits. A multilayer printed circuit board incorporates multiple layers of circuitry separated by layers of dielectric material typically composed of woven glass impregnated with epoxy resin. The resin-impregnated glass firmly bonds together and electrically isolates the layers of circuitry. When properly laminated, a multilayer printed circuit board has uniform thickness, and each of the circuitry layers is precisely aligned with respect to the others. Such a multilayer board also has an even resin distribution with no air or volatiles trapped in the resin between the circuitry layers. These desirable qualities are even more important when the boards are used in harsh environments such as those typically found in military applications.

Multilayer boards are typically laminated by first interleaving layers of resin-impregnated glass with layers of circuitry, each layer of cicuitry being bonded to a respective side of a woven glass substrate for support. Several layers of resin-impregnated glass are usually placed in between the layers of circuitry. After the layers of circuitry are carefully aligned with respect to each other, a plurality of metal grommets are inserted through all the layers at their peripheries. The grommets serve to preserve the alignment of the layers of circuitry during the laminating process. The composite just described is then placed in a press where it is subject to pressure and heat, which cause the resin in the resinimpregnated glass to become substantially liquid. After a predetermined period of time, the temperature and pressure are both increased to solidify the resin and cure the composite into a printed circuit board.

The press typically used in the above-described process is a standard hydraulic press with a number of heated platens between which the composites are pressed. This type of press has a single piston rod for applying pressure at the centers of the platens and a plurality of platen guides, usually located at the corners of the platens, for guiding the platens during the pressing operation. A typical hydraulic press may have a number of additional platens disposed between the two outermost platens to form a plurality of openings, or "daylights," so that a number of composites may be simultaneously laminated within the press.

A number of problems have arisen from the use of this process in manufacturing multilayer printed circuit boards. It was discovered that the use of a single piston centrally located on the platens caused visible imperfections on the circuit boards, and that these imperfections could be prevented with the use of an increased amount of pressure. However, the use of greater pressure resulted in a number of other problems. Since the pressure was exerted at a single area on the platens, there was substantial variance in pressure across the platens, with the greatest pressure being exerted at the central portion of each platen and substantially less exerted about the periphery. When the resin in the composite became liquid during the heating process, the pressure gradient across the platens caused a substantial amount of resin flow from the central portion of each platen to the periphery. Substantial amounts of liquid resin would be squeezed out the sides of the composite, resulting in resin waste. As a result, more layers of glass were required between the layers of circuitry.

Even through an increased amount of pressure was used, underside air and volatiles still remained trapped within the resin between the layers of circuitry.

The pressure gradient also caused resin starvation of the middle of the multilayer boards, which resulted in lower dimensional stability. Multilayer boards produced in this manner were found to have substantial variations in thickness from their central portions to their peripheries, resulting in an undesirable increase in dielectric variance across the areas of the boards.

Applying pressure to a single, central area on the platens also caused increased slippage of the composite with respect to the platens, resulting in the need to use many grommets about the periphery of the composite in order to increase its coefficient of friction.

In order to increase the pressure uniformity, smaller composites were used which were substantially less in area than the area of the platens. The use of smaller composites greatly decreased the productivity of the presses used in the laminating process.

The center piston press used in this laminating process has a "restrictive frame," which typically has four bolster guide rods located at the corners of the platens to keep them horizontal. Each corner of the bolster plate has an aperture and a bushing within the aperture to accommodate the bolster guides. The bolster guides and the bushings are machined to extremely close tolerances in order to keep the bolster plate strictly parallel to the head plate. These rigidly parallel plates cause problems in the laminating process when a composite having nonuniform thickness is processed. Such a composite receives the most pressure at the thickest part and substantially less pressure at the thinner parts, causing a pressure gradient across the composite which contributes to the problem described above.

These hydraulic presses also have a system of hanger rods where more than two platens are displaced between the bolster and the head of the press. The hanger rods are used to support each of the intermediate platens so that a number of printed circuit boards can be simultaneously laminated. Each intermediate platen has its own set of hanger rods. As a result, many sets of hanger rods are required when many boards are to be simultaneously laminated. In addition, although some of the hanger rod systems are capable of being adjusted to vary the height of the intermediate platens, the adjustment mechanisms are crude, making it difficult to finely adjust the height of each platen within the press.

SUMMARY OF THE INVENTION

The present invention provides a new method of laminating printed circuit boards which eliminates the problems caused by prior methods. In this new method, layers of polymer- or resin-impregnated finely woven glass threads are interleaved with layers of circuitry, each layer of circuitry being bonded to a respective side of a substrate. After the layers of circuitry are carefully aligned with respect to each other, heat and pressure are applied to the composite just described until the resin in the resin-impregnated glass is substantially liquefied. The pressure is applied at the periphery of each of the platens at points which lie outside the area between the platens occupied by the composite. The pressure applied in this manner is substantially constant across the platens, and hence, across the composite. When the resin in the composite is liquid, the hydraulic press may be repeatedly opened and closed. Higher levels of heat and pressure are then applied to the composite for a predetermined period of time to cure it into a laminated printed circut board. The heating and pressing steps may be performed in a substantially evacuated environment.

This even application of pressure allows a much lower level of pressure to be used, which decreases the flow of liquid resin within the composite, saving substantial amounts of resin-impregnated material, reducing circuit layer alignmnet problems, and eliminating resin starvation at the center of the composite, thus increasing the dimensional stability of the laminated circuit board. In addition, printed circuit boards laminated by this process exhibit superior dielectric qualities resulting from the increased uniformity in board thickness. This method also reduces the likelihood of composite slippage thus substantially reducing the need for anti-slip grommets.

The use of an evacuated environment during the liquid resin stage also reduces the amount of air and volatiles within the resin between the circuitry layers, which results in improved dielectric qualities. Opening and closing the press while the composite is subject to a vacuum further improves the dielectric qualities of the printed circuit boards.

In addition to these improved qualities of laminated circuit boards, the utilization of this new method has, at least in one case, lowered the board defect rate from 20% to 2%.

The present invention also includes a hydraulic press used in the lamination of printed circuit boards. The press includes at least one pair of platens, each of which has a substantially flat surface between which alternate layers of circuitry and dielectric material are compressed and heated to form a multilayer printed circuit board. The platens are translated relative to each other by a number of pistons and piston rods which are displaceable within a number of cylinders when hydraulic fluid is introduced into the cylinder ports. The press may also include a number of inner platens located between the two outermost platens and a system of hanger rods for supporting the inner platens.

Each of the vertical hanger rods for horizontally has a lengthwise slot which varies in depth to form a plurality of steps within the slots. A number of connectors (guides), which are fixed to each of the inner platens, have bores through their centers through which the hanger rods pass. Each of these connectors has an adjustable eccentric bolt which protrudes into one of the slots in the hanger rods and rests on one of the steps therein in order to support the connector and the inner platen. The height of the inner platens may be adjusted by rotating the eccentric bolts. The top end of each hanger rod is threaded in the head plate of the press so that the height of the steps in each rod may be adjusted by rotating the rods. Thus, the height of each of the inner platens may be adjusted either by rotation of the hang rods of the eccentric bolts, with the eccentric bolts enabling fine adjustment of the inner platens.

BRIEF DESCRIPTION OF THE DRAWINGS

FIG. 3 is a sectional side view of the platen support system taken along lines 3—3 in FIG. 2.

FIG. 4 is a top view of the platen support system taken along lines 4—4 in FIG. 2.

FIG. 5 is a side view of an eccentric bolt used in the platen support system of the present invention.

FIG. 6a is a sectional side view of an eccentric bolt mounted in a first position in a hanger rod.

FIG. 6b is a side sectional view of an eccentric bolt mounted in a second position in a hanger rod.

FIG. 7 is a perspective view of another embodiment of a hanger bracket used in the platen support system of the present invention.

DETAILED DESCRIPTION OF THE PREFERRED EMBODIMENTS

Figure 1:
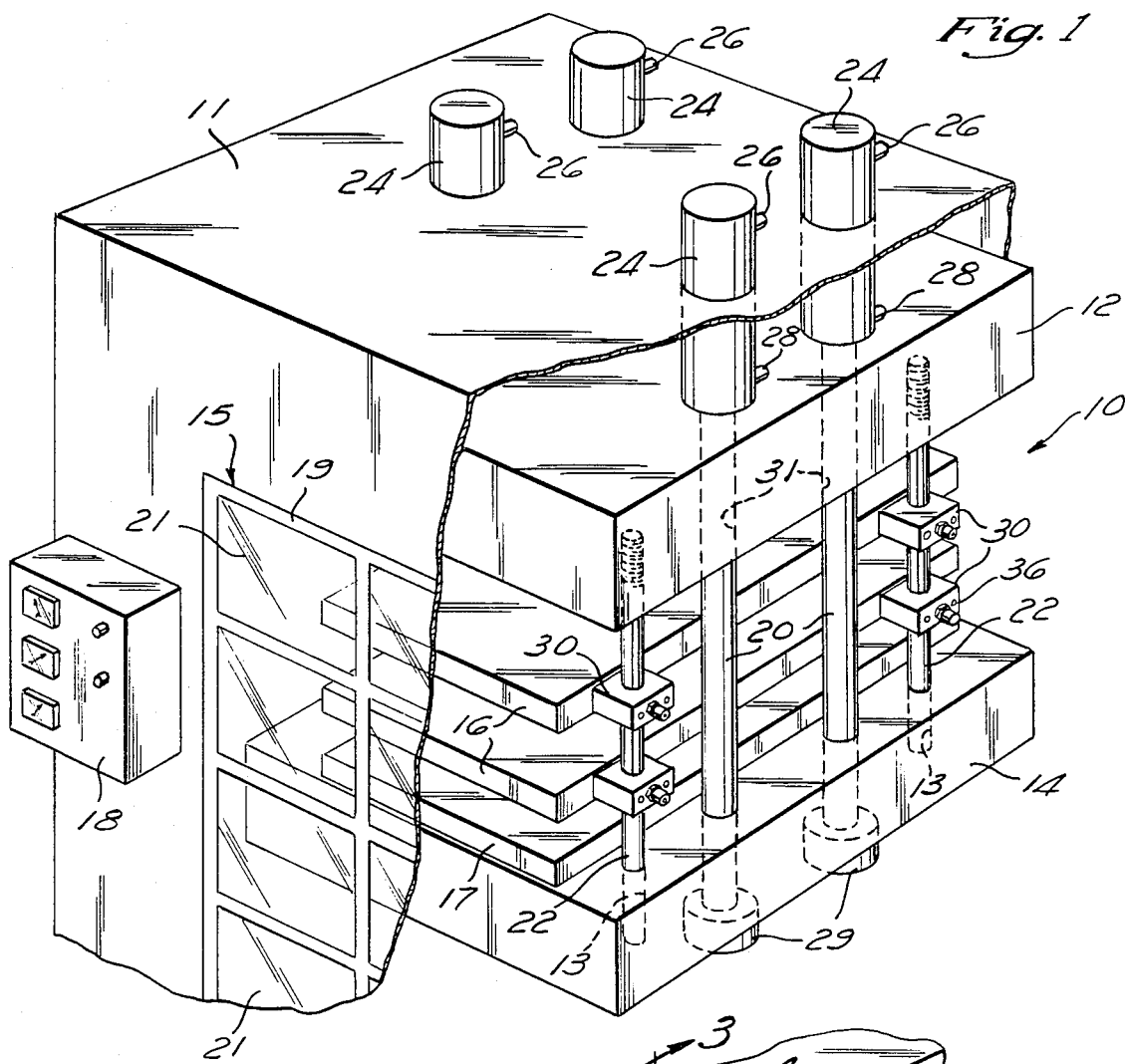
FIG. 1 is a perspective view of the hydraulic press of the present invention with portions removed for clarity.

As illustrated in FIG. 1, the hydraulic press of the present invention has a rectangular steel head plate 12 and a rectangular steel bolster plate 4 interconnected by four piston rods 20. The head and bolster plates 12, 14 are preferably up to eight inches thick in order to provide little or no flexibility under load. The head plate 12 is supported fixedly in place by a conventional U-shaped steel frame 11. The bolster plate 14 is supported by four cylindrical spanner nuts 29 threadably attached to the piston rods 20. Each piston rod 20 is attached to a piston 27 (shown in FIG. 8) which is driven within a respective cylinder 24. The head plate 12 has four bores 31 to accommodate the piston rods 20. Each cylinder 24 has a pair of hydraulic ports 26, 28 for the admission and exhaustion of hydraulic fluid. Attached to the bolster plate 14 is an outer platen 17 with a substantially smooth upper surface. The surfaces of the platens 16, 17 are machined and precision ground to be perfectly smooth to within 5/1000 of an inch per foot. Likewise, another outer platen (not shown) is fixedly attached to the head plate 12. Two additional inner platens 16 are also displaced between the head plate 12 and the bolster plate 14. These inner platens 16 are supported by four hanger rods 22 which are threadably connected to the head plate 12. The lower ends of the hanger rods pass through and are capable of travelling within four bores 13 in the bolster plate 14. The press 10 also includes a control panel 18 and appropriate controls (not shown) which can be programmed to independently adjust the pressure and temperature at which the press operates. The press also includes a pair of doors 15 attached to the U-shaped frame 11 which can be closed to form an air tight seal with the frame to enable the laminating environment within the press 10 to be evacuated. Each of the doors 15 has a steel frame 19 in which a plurality of windows 21 are formed. The windows 21 incorporate transparent plastic to enable visual inspection during the laminating process.

Each piston 27 has four piston rings (not shown), two of which are made of teflon and two of which are made of torlon, a plastic manufactured by Amoco Chemicals which has extremely high tensile and structural strength. The combination of teflon and torlon piston rings provides an extremely low piston breakaway pressure, prevents cylinder scoring when the bolster plate 14 is subject to side loads, and provides low friction piston travel within the cylinders 24. In addition to the piston rings, the bottoms of the cylinders 24 incorporates a plurality of teflon and torlon seals (not shown) through which the piston rods 20 travel. These seals also offer the advantages just described.

Figure 2:
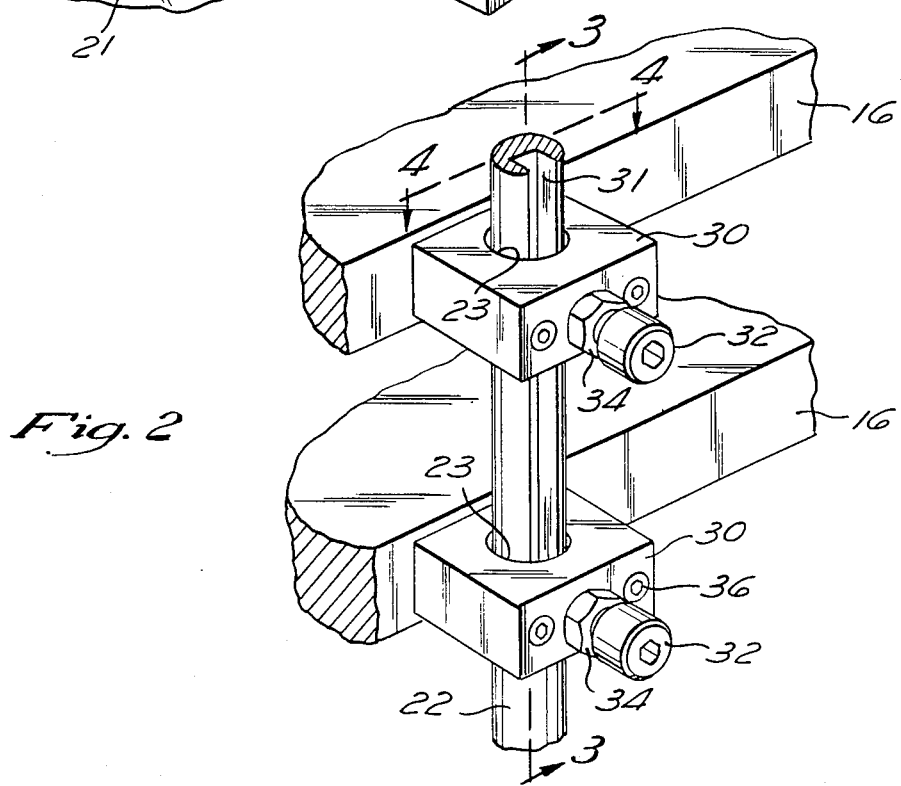
FIG. 2 is a partial perspective view of the platen support system used in the present invention.

The platen support system can be explained more fully with reference to FIGS. 2-4. Each of the platens 16 has a plurality of hanger brackets 30 attached via a pair of hanger bolts 36. Each of the hanger bracket 30 has a circular opening 23 at its center to allow a hanger rod 22 to pass through. Each of the hanger rods 22 has a lengthwise slot 31. The slots 31 have different depths at different points along the rods 22 to form a number of abutment points, shown in the figures as steps 46. The eccentric bolts 32 are threadably connected to the hanger brackets 30 and have eccentric portions 44 which rest on the steps 46 and the hanger rods 22. Each of the eccentric bolts 32 is provided with a locking nut 34.

The press overcomes the "restrictive frame" problem of other center piston presses, thus allowing composites of nonuniform thickness to be subject to even pressure regardless of differences in height. Such nonuniformities may be caused by initial thickness variances in the layers used or by variances induced by the melting of the resin in the composite. This result is accomplished in part because the platens 16, 17 or not held strictly parallel to each other. As illustrated in FIG. 4, the diameter of each hanger rod 22 is 1/16 of an inch smaller than the diameter of the bore 23 in the hanger bracket 30. This difference in diameters permits a substantial amount of variance in parallelism of the platens 16, 17 when the press 10 is closed. Thus, when a composite height nonuniformity is encountered, the platens 16 may tilt with respect to each other so that pressure is nevertheless applied evenly across the composite. As a result, increased resin flow and the problems associated thereto are substantially reduced. The hanger brackets 30 still provide a substantial amount of platen guidance, which is advantageous, especially where automated loading and unloading of the press is utilized.

This restrictive frame problem is also overcome by the use of the teflon and torlon rings and seals. The outer diameter of the rings is 5/1000 of an inch less than the inner diameter of the cylinders 24. The diameter of the cylinder seals is 5/1000 of an inch greater than the diameter of the piston rods 20. In addition, the bores 31 in the head plate 12 through which the cylinders 20 pass have inner diameters which are at least 1/32 of an inch greater than the diameters of the cylinders 20. As a result of these tolerances, the outer platens are rotationally displaceable with respect to the horizontal. When displaced in this manner, there can be up to 20/1000 of an inch displacement in height at one side of the platens 17 when the other side of the platens 17 are in contact. This nonrestrictive frame also affords each of the piston rods 20 substantially independent displaceability within the cylinders 24.

An alternative hanger bracket 70 is illustrated in FIG. 7. This hanger bracket 70 has a horseshoe-shaped opening 72 instead of a circular one to accommodate one of the hanger rods 22. The bracket 70 also has the two circular openings 74 for the hanger bolts 36 and a threaded central opening 76 for the offset bolt 32. The bracket 70 allows easier installation of the platens 16 since the bracket 70 can be placed over each rod 20 without having to insert the rod through the bracket 70.

The height of each of the inner platens 16 can be adjusted in two ways. As illustrated in FIG. 1, each hanger rod 22 is threaded at the top. The height of the same corner on each of the platens 16 may be simultaneously adjusted by rotating one of the hanger rods 22 a number of full revolutions.

In order to accomplish the height adjustment, the locking nut 34 on each of the hanger brackets 30 surrounding the hanger rod 22 to be rotated is loosened and each of the associated eccentric bolts 32 is rotated until its eccentric portion 44 is fully retracted into its associated hanger bracket 30 and does not extend into the slot 31 in the hanger rod 22. The rod 22 may then be rotated any number of revolutions up or down to adjust the height of one corner of each of the platens 16. When the desired height is obtained, the slots 31 are realigned and the eccentric bolts 32 are reinserted so that their eccentric portions 44 rest on the steps 46 within the rods 22.

There is also a second manner of adjustment of the height of the platens 16. Each of the corners of the platens 16 may be independently raised or lowered by rotating its respective eccentric bolt 32. As indicated in FIG. 5, each eccentric bolt 32 has an eccentric portion 44 with a circular cross section. Because the portion 44 which rests on the step 46 is offset from the center of the bolt 32, rotation of the bolt 32 raises or lowers the height of the platens 16 with respect to the hanger rods 22 as indicated in FIGS. 6a and 6b.

It should be apparent from the above description that the platens 16, along with the associated brackets 30 and bolts 32, may travel upward within the slot 31 in the hanger rods 22. Thus, when the press 10 closes by the bolster plate 14 moving towards the head plate 12, the platens 16, 17 successively come in contact with and are raised by the bolster plate 14, and are in contact with each other when the press is fully closed.

Figure 8:
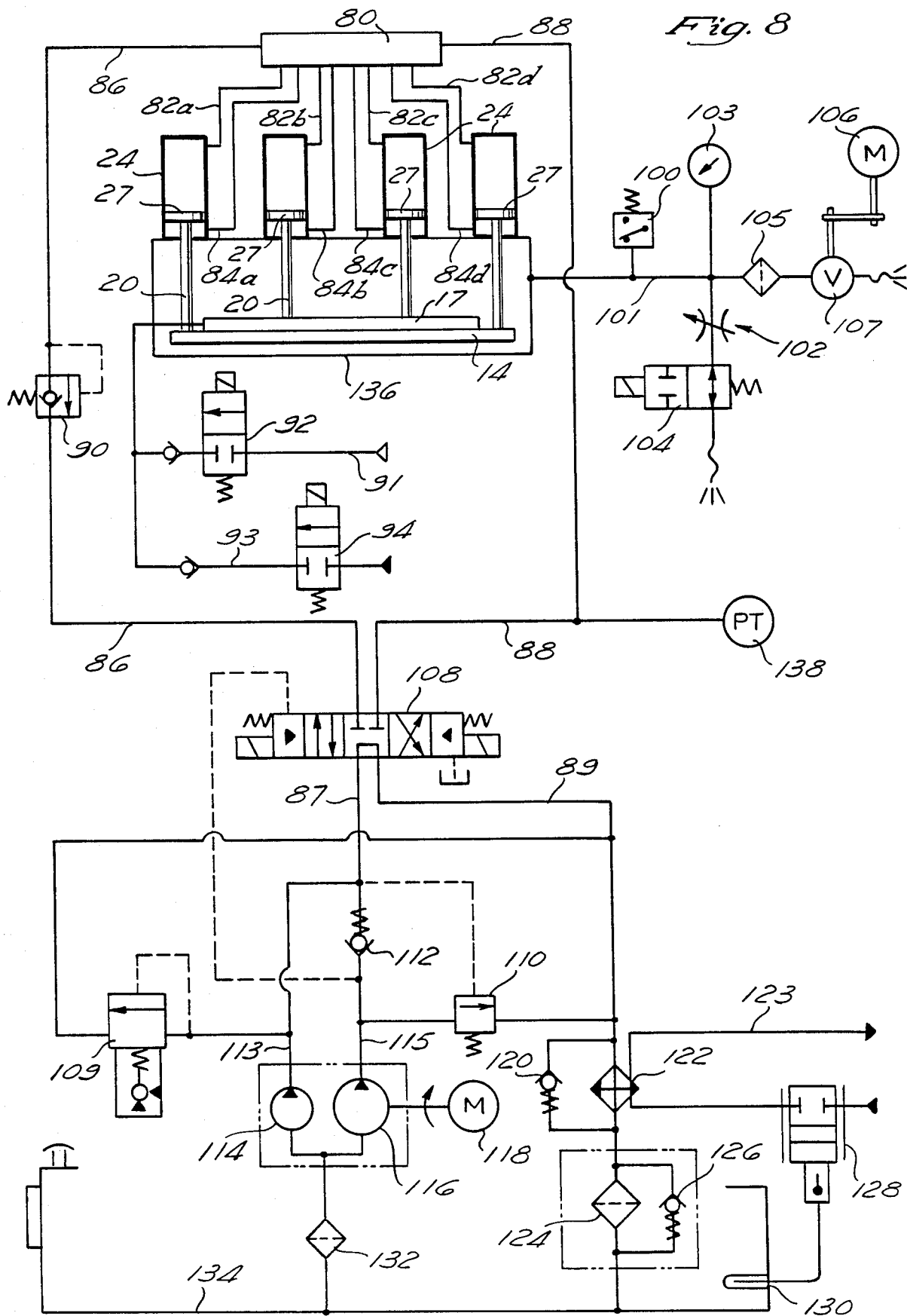
FIG. 8 is a schematic view of a number of fluid systems used in the present invention.

FIG. 8 illustrates the various fluid systems within the press 10. These systems include a hydraulic system for moving the bolster plate 14 up and down, a cooling system for cooling each of the platens, and a vacuum system for providing a substantially evacuated environment in which to manufacture the circuit boards.

As shown in FIG. 8, each of the piston rods 20 is attached to a piston 27 at one end and to the bolster plate 14 at its other end. The pistons 27 are displaced within the cylinders 24 to raise or lower the bolster plate 14 depending upon the direction of the flow of hydraulic fluid within a number of hydraulic lines 82, 84 attached to the hydraulic ports 26, 28 of the cylinders 24. The hydraulic lines 82, 84 are attached to a synchro valve 80 which is in turn connected to two hydraulic lines 86, 88. In addition to channeling the hydraulic fluid among lines 82, 84, 86, 88, the synchro valve 80 also ensures that the lines 82, 84 exert the same pressure on each of the pistons 27. Thus, at any point in time, each piston rod 20 is pulling or pushing the plate 24 with an equal amount of force. This equalization is accomplished by the incorporation of two non-turbulent flow manifolds (not shown) in the valve 80. Lines 82a-d are connected to a single manifold while lines 84a-d are connected to a second manifold. Because each is connected to a single manifold, the lines 82a-d have substantially equal internal pressures, as well as lines 84a-d. These manifolds also incorporate internal structures which at to smooth out any flow surges which might cause pressure variations.

The valve 80 has two hydraulic lines 86, 88 which are supplied from a small fixed displacement pump 114 and a large fixed displacement pump 116 driven by a motor 118 through a three-position, four-way valve 108. The pumps 114, 116 draw hydraulic fluid for a reservoir 134 through a filter 132 and supply it to the valve 108 via a small pump supply line 113 and a large pump supply line 115. The position of the valve 108 determines the direction of flow through the lines 86, 88 and as a result, whether the press opens or closes.

The energy efficiency of the hydraulic system is increased by incorporating the small pump 114, since it alone is capable of keeping the press closed after both pumps 114, 116 have been used to close it.

In order to close the press, the valve 108 is positioned so that hydraulic fluid is admitted to the synchro valve 80 and passed through lines 84a–84d to be admitted into the cylinders 24 at the lower hydraulic ports 28. The admission of the hydraulic fluid into the lower ports 28 forces the pistons upward, thus closing the press. At the same time hydraulic fluid is admitted into the lower ports 28 via lines 84, hydraulic fluid is expelled from the cylinders 24 at the upper ports 26 via lines 82a–82d. This hydraulic fluid is returned to the reservoir 134 via the lines 86 and 89.

The hydraulic line 86 includes a counterbalance valve 90 to regulate the upstream pressure of the returning hydraulic fluid. The effect of this valve 90 is to maintain a slight downward pressure on the pistons 27 as they are raised within the cylinders 24. This slight downward pressure makes the press 10 close more smoothly.

In order to open the press, the valve 108 is activated to reverse the direction of the hydraulic flow within the lines 86, 88 which operates to reverse the flow though the lines 82, 84 and open the press.

A servo-controlled relief valve 109 is connected between the small pump supply line 113 and the return line 89. The valve 109 regulates the pressure supplied to the hydraulic lines 86, 88 via line 87 and dumps any excess hydraulic fluid into the return line 89. An unloading valve 110 is connected between the large pump supply line 115 and the return line 89 and acts to dump the contents of the large pump 116 into the return line 89 when the press is closed. Thus, only the small pump 114 is working to supply pressure to line 88 when the press is closed.

The temperature of the hydraulic fluid in the system is controlled by regulating the temperature of the hydraulic fluid in the reservoir 134. Before being returned to the reservoir 134 via the return line 89, the hydraulic fluid is cooled and filtered. The cooling is performed by a heat exchanger 122 through which a water line 123 flows. The flow of water though the line 123 is modulated by a temperature-controlled valve 128 which is connected to receive the temperature of the hydraulic fluid in the reservoir 134 via a thermocouple 130. A check valve 120 is connected in parallel with the heat exchanger 122 to protect it in case of pressure surges. After the hydraulic fluid is cooled, it passes through a filter 124 connected in parallel with a check valve 126 to accommodate any surges in pressure and any excess pressure resulting from clogging of the filter 124.

The hydraulic press of the present invention incorporates the use of a cooling system to cool the electrically heated platens 16, 17. FIG. 8 illustrates an air line 91 and a water line 93 which are connected to a platen 17 resting on the bolster plate 14. While all of the platens 16, 17 are not shown here, each has a similar cooling system. These lines 91, 93 supply air and water which circulates throughout the interior of the platen 17. The line 91 is connected to an air valve 92 which modulates the flow of air into the platen 17, and the line 93 is connected to a water valve 94 which regulates the flow of water into the platen 17. The rate of cooling of the platen 17 can be controlled by appropriate control of the valves 92, 94. In order to cool the platens, a mixture of air and water are blown through their interiors for 30 seconds after the heat is removed. After a period of 30 seconds, the flow of air is shut-off and just water is circulated to accomplish more rapid cooling. After the platens are completely cooled and the press reloaded with composites, straight air is blown through the line 93 to remove the water remaining in the platen interiors prior to the next heating stage.

The present invention also incorporates the use of a (schematically shown) vacuum chamber 136 formed by the frame 11 and the doors 15 so that the printed circuit boards can be laminated in a substantially evacuated environment. The vacuum is provided in the vacuum chamber 136 by an air line 101 connected to a vacuum pump 107 driven by a motor 106. When the vacuum switch 100 is activated, the air valve 104 is closed and the air within the vacuum chamber 136 is drawn out though the air line 101 and the air filter 105. A vacuum gauge 103 indicates the degree of vacuum, which has been achieved within the chamber 136.

When the switch 100 is deactivated in order to terminate the vacuum within the chamber 136, the valve 104 is opened to admit outside air through a needle valve 102 into the chamber 136 via line 101. The valve 102 is adjustable and controls the rate of pressurization of the chamber 136.

The present invention also includes a novel method of laminating multilayer printed circuit boards. The first step in this manufacturing method consists of interleaving alternate layers of dielectric material and substrates which contain printed circuits. The dielectric material consists of finely woven glass fibers impregnated with epoxy resin. Several layers of dielectric material may be inserted between the layers of circutry. The substrates to which the circuitry layers are bonded are then carefully aligned in order to ensure proper electrical operation. The composite just described is then placed between a pair of platens in the vacuum chamber of a hydraulic press. The pressure within the vacuum chamber is then reduced until the vacuum chamber is substantially evacuated. After a full vacuum is reached, the press is gradually closed until it exerts pressure on the composite. This initial pressure, which may vary from 15–50 pounds per square inch, is typically about 20 pounds per square inch. While this pressure is being exerted on the composite, the platens are heated to gradually increase the temperatures of the composite. The temperature of the composite is ramped up from room temperature to approximately 180° to 210° Fahrenheit in about 8 minutes. At this point the resin in the glass starts to melt. The temperature is maintained for approximately another 1–5 minutes after which time all of the resin within the dielectric layers has melted and become substantially liquid.

The next stage in the process is degasification. While the resin remains liquid, there is a small amount of resin flow, which is desirable to insure an even distribution of resin throughout the printed circuit board. Also, air and volatiles trapped within the liquid resin can be removed under the combined influence of a vacuum and a number of pressure variations which are induced by alternately opening and closing the press. These successive variations in pressure cause increased horizontal migration of air and volatiles from the interior of the composite to its exterior where the air and volatiles can be flushed away by the vacuum, thus creating printed circuit boards with superior dielectric qualities.

After the degasification stage, the pressure on the composite is gradually increased, or ramped up, until it lies in the range 80–250 pounds per square inch. At the same time that the pressure in increased or shortly thereafter, the temperature is also increased, or ramped up, until it is approximately 350° Fahrenheit. The pressure and temperature are left at his level for approximately 45 minutes to one hour in order to cure the composite. After this cure stage, the composite is cooled by circulating air and water through each of the platens 16, 17 and a laminated circuit board results.

The heating and cooling of the platens 16, 17 is performed by a temperature controller which controls three heating elements located in each platen as well as the cooling system illustrated schematically in FIG. 8. The user may program the controller to ramp the temperature of the composite up or down within a programmable period of time.

Substantial modifications of the press and method may be made without departing from the spirit of the invention. For example, the hanger rods 22 might be manufactured to have square instead of circular crosssections with cylindrically shaped threaded ends. Further, although the depths of the slots 31 change in discrete steps 46, the slots 31 may be manufactured with a continuously changing depth. While the press is closed by raising the bolster plate 14 to the head plate 12, the pressing operation may still be accomplished by lowering the plate 12 to the plate 14. In addition, the temperature control system within each platen 16, 17 may comprise hot oil heating and cooling instead of electric heating and water cooling.

Further modifications and alternative embodiments of the invention will be apparent to those skilled in the art in view of the foregoing description. Accordingly, this description is to be construed as illustrative only, and is for the purposes of teaching those skilled in the art a manner of carrying out the invention. The details of the structure may be varied substantially without departing from the spirit of the invention, and the exclusive use of such modifications as comes within the scope of the appended claims is contemplated.

What is claimed is:

1. A press comprising:
   a pair of outer platens;
   a plurality of pistons and piston rods disposed about the periphery of said outer platens for pulling one of said outer platens towards the other of said outer platens, said pistons being connected to said piston rods;
   a plurality of cylinders, said pistons and said piston rods being displaceable within said cylinders when hydraulic fluid is introduced into said cylinders;
   a plurality of inner platens located between said outer platens;
   a plurality of inner platen guides for providing a substantial amount of inner platen guidance yet allowing said inner platens to be substantially non-parallel during a pressing operation whereby a composite of non-uniform thickness being pressed is subject to a substantially even amount of pressure across its area regardless of differences in height; and
   a plurality of vertical hanger rods for horizontally supporting said inner platens between said outer platens, at least one of said hanger rods having means supporting each of said inner platens in spaced relation when said outer platens are fully displaced from one another said hanger rods passing through said inner platens guides.

2. A press as claimed in claim 1 wherein said one of said hanger rods has a plurality of abutment points along its length, said inner platens being supportable by said one of said hanger rods at said abutment points.

3. A press as claimed in claim 1 additionally comprising a plurality of connectors fixed to one of said inner platens, said one of said hanger rods having a slot along its length, said slot having an abutment point at which one of said connectors can rest to support said inner platen, said one of said connectors being adjustable to alter the height of one corner of said one of said inner platens with respect to the same corner of another of said inner platens.

4. A press as claimed in claim 3 wherein said abutment point comprises a step formed in said slot.

5. A press as claimed in claim 3 wherein said one of said hanger rods is threadably connected to a frame for supporting one of said outer platens, said one of said hanger rods being rotatable with respect to said platens to provide a second manner of adjustment.

6. A press comprising:
   a pair of outer platens;
   a plurality of pistons and piston rods disposed about the perphery of said outer platens for pulling one of said outer platens towards the other of said outer platens, each of said pistons being connected to one of said piston rods, a substantially constant fluid pressure being supplied to the side of said pistons adjacent said piston rods so that one of said outer platens is pulled towards the other of said outer platens, said pistons and said piston rods being the only source of guidance for said outer platens;
   a plurality of cylinders, each of said cylinders with a pair of hydraulic ports, said pistons and said piston rods being substantially independently displaceable within said cylinders when hydraulic fluid is introduced into said ports so that said outer platens may be substantially non-parallel during a pressing operation whereby a composite of nonuniform thickness being pressed is subject to a substantially even amount of pressure across its area regardless of differences in height;
   a plurality of inner platens located between said outer platens;
   a plurality of vertical hanger rods for horizontally supporting said inner platens between said outer platens, each of said hanger rods having a lengthwise slot varying in depth to form a plurality of steps within each of said slots;
   a plurality of connnectors fixed to each of said inner platens, said hanger rods passing through said connectors; and
   a plurality of adjustable bolts, each of said bolts connected to one of said connectors and protruding into one of said slots, said bolts capable of supporting said inner platens by resting on said steps.

7. A platen support system for a press comprising:

a plurality of outer platens;

a plurality of inner platens supported between said outer platens, said inner platens locatable at different height levels;

a plurality of rods for supporting said inner platens at said height levels, at least one of said rods having a plurality of abutment points along its length capable of supporting said inner platens at said height levels;

a threaded portion on at least one of said rods for adjusting the height of a corner of one of said inner platens with respect to the same corner of another of said inner platens; and a bolt for adjusting the height of one of said inner platens independently of another of said inner platens, said bolt having an eccentric portion which rests on a step formed in a groove in one of said rods.

8. A platen support system for a press comprising:

a plurality of platens, said platens locatable at different height levels;

a plurality of rods for supporting said platens at said height levels;

first adjustment means for adjusting the heights of said platens, said first adjustment means comprising threaded portions on said rods; and second adjustment means for finely adjusting the heights of said platens with respect to said rods, said second adjustment means comprising a lengthwise slot in one of said rods, said slot having a varying depth, and a plurality of connectors fixed to said platens, one of said connectors including a bolt having an eccentric portion capable of projecting into said slot in order to support one of said platens on said rods.

9. A press as claimed in claim 1 wherein said inner platen guides comprise a plurality of hanger brackets connected to each of said inner platens, said hanger brackets having bores through which said hanger rods pass.

10. A press as claimed in claim 9 wherein the diameter of said bores is substantially greater than the diameter of said hanger rods.

11. A press as claimed in claim 10 wherein the diameter of said bores is approximately 1/16 of an inch greater than the diameter of said hanger rods.

12. A press as claimed in claim 1 additionally comprising a plurality of piston rings connected to said pistons, the outer diameter of said piston rings being substantially less than the inner diameter of said cylinders.

13. A process as claimed in claim 12 wherein the outer diameter of said piston rings is approximately 5/1000 of an inch less than the inner diameter of said cylinders.

14. A press as claimed in claim 12 additionally comprising a plurality of cylinder seals connected to said cylinders, said cylinder seals having an inner diameter that is substantially greater than the diameter of said piston rods.

15. A press as claimed in claim 14 wherein the inner diameter of said cylinder seals is approximately 5/1000 of an inch greater than the diameter of said piston rods.

* * * * *

UNITED STATES PATENT AND TRADEMARK OFFICE
CERTIFICATE OF CORRECTION

PATENT NO.    : 4,857,135

DATED         : August 15, 1989

INVENTOR(S)   : John B. Copp

It is certified that error appears in the above-identified patent and that said Letters Patent is hereby corrected as shown below:

In Column 2, at line 10, change "Even through an" to --Even though and--.

In Column 3, at line 50, change "of hanger rods for supporting the inner platens" to --of vertical hanger rods for horizontally supporting the inner platens--.

In Column 3, at line 52, change "verticle hanger rods for horizontally has a lengthwise" to --hanger rods has a lengthwise--.

In Column 3, at line 63, change "threaded in the" to --threaded into the--.

In Column 3, at line 67, change "the hang rods" to --the hanger rods--.

In Column 4, at line 27, change "bolster plant 4" to --bolster plate 14--.

UNITED STATES PATENT AND TRADEMARK OFFICE
CERTIFICATE OF CORRECTION

PATENT NO. : 4,857,135

DATED : August 15, 1989

INVENTOR(S) : John B. Copp

It is certified that error appears in the above-identified patent and that said Letters Patent is hereby corrected as shown below:

In Column 5, at line 11, change "hanger bracket 30" to -- hanger brackets 30--.

In Column 5, at line 29, change "or not held" to --are not held--

In Column 10, at line 16, change "in Claim 1" to --in Claim 2--.

In Column 12, at line 20, change "A process" to --A press--.

Signed and Sealed this

Twelfth Day of May, 1992

Attest:

DOUGLAS B. COMER

*Attesting Officer*   Acting Commissioner of Patents and Trademarks